(12) United States Patent
Fukuma et al.

(10) Patent No.: US 8,479,607 B2
(45) Date of Patent: Jul. 9, 2013

(54) WORK TRANSFER APPARATUS

(75) Inventors: Kunio Fukuma, Osaka (JP); Hideki Matsuo, Osaka (JP)

(73) Assignee: DAIHEN Corporation, Osaka (JP)

( * ) Notice: Subject to any disclaimer, the term of this patent is extended or adjusted under 35 U.S.C. 154(b) by 839 days.

(21) Appl. No.: 12/647,194

(22) Filed: Dec. 24, 2009

(65) Prior Publication Data

US 2010/0196124 A1 Aug. 5, 2010

(30) Foreign Application Priority Data

Dec. 26, 2008 (JP) .................. 2008-333559

(51) Int. Cl.
*B25J 17/00* (2006.01)
*B25J 18/00* (2006.01)
*F28F 7/00* (2006.01)
*F28F 3/12* (2006.01)

(52) U.S. Cl.
USPC .......... 74/490.01; 74/490.08; 74/490.09; 414/735; 414/744.3; 414/749.1; 414/787; 187/269; 901/15; 901/17; 901/19; 901/28; 901/50

(58) Field of Classification Search
USPC ............ 414/744.3, 735, 749; 901/28, 29, 901/15, 17; 74/490.01, 490.08, 490.09; 187/269
See application file for complete search history.

(56) References Cited

U.S. PATENT DOCUMENTS

| | | | | |
|---|---|---|---|---|
| 5,667,353 A | * | 9/1997 | Drake | 414/744.3 |
| 6,371,713 B1 | * | 4/2002 | Nishimura et al. | 414/222.13 |
| 6,662,673 B1 | * | 12/2003 | Olgado | 74/490.01 |
| 2008/0190707 A1 | * | 8/2008 | Hoth | 187/269 |

FOREIGN PATENT DOCUMENTS

| | | |
|---|---|---|
| JP | 3-136789 | 6/1991 |
| JP | 8-288681 | 11/1996 |
| JP | 2007-118171 A | 5/2007 |

* cited by examiner

Primary Examiner — Scott Lowe
(74) Attorney, Agent, or Firm — Hamre, Schumann, Mueller & Larson, P.C.

(57) ABSTRACT

A work transfer apparatus includes a work carrying mechanism, a driving source that drives the work carrying mechanism, a sealed box that accommodates the driving source in a hermetically sealed state, and a coolant circulation path provided in the sealed box for cooling the driving source. The sealed box includes a box body with an opening, and a partition lid for closing the opening. The partition lid includes an outer plate member and an inner plate member superposed on the outer plate member. The coolant circulation path is disposed at the interface between the outer plate member and the inner plate member.

6 Claims, 10 Drawing Sheets

WORK TRANSFER APPARATUS

BACKGROUND OF THE INVENTION

1. Field of the Invention

The present invention relates to a work transfer apparatus that carries a plate-shaped work in a vacuum, for example.

2. Description of the Related Art

A conventional transfer apparatus for carrying a plate-shaped work is described in Japanese Laid-open Patent Publication No. 2007-118171, for example. The work transfer apparatus taught by this document includes a fixed base, a pivotal base supported by the fixed base, a lifting base supporting the pivotal base, a ball screw slide mechanism that vertically moves the lifting base, a link arm mechanism supported by the pivotal base, and a hand supported by the link arm mechanism.

The hand and the link arm mechanism are located in a vacuumed chamber, while the fixed base is located in a space outside of the chamber, exposed to the atmospheric pressure. Inside the fixed base are provided various driving motors such as a motor for rotating the pivotal base and a motor for driving the link arm mechanism. The conventional work transfer apparatus is employed to carry a work heated to high temperature, and the radiant heat from the work may affect the peripheral components. In light of this, the link arm mechanism, which is exposed most to the radiant heat, is provided with a coolant circulation path for cooling the peripheral components.

In the foregoing work transfer apparatus, the various driving motors are arranged in the fixed base so that they are in an atmospheric-pressure space. By this arrangement, however, the fixed base tends to be large, and hence the overall size of the transfer apparatus is also large.

SUMMARY OF THE INVENTION

The present invention has been proposed under the circumstances described above. It is therefore an object of the present invention to provide a work transfer apparatus which is more compact than is conventionally possible.

According to an embodiment of the present invention, there is provided a work transfer apparatus comprising: a work carrying mechanism that carries a work; a driving source that drives the work carrying mechanism; a sealed box that accommodates the driving source in a hermetically sealed state; and a coolant circulation path provided in the sealed box for cooling the driving source.

Preferably, the sealed box may include a box body with an opening, and a partition lid for closing the opening, where the partition lid includes an outer plate member and an inner plate member superposed on the outer plate member, and the coolant circulation path is disposed at an interface between the outer plate member and the inner plate member.

Preferably, the work transfer apparatus of the present invention may further comprise an air-tight seal disposed between a periphery of the opening and the outer plate member. The inner plate member may be entirely located within the box body.

Preferably, the work transfer apparatus of the present invention may further comprise an air-tight seal disposed between the outer plate member and the inner plate member for preventing coolant supplied into the coolant circulation path from leaking from the partition lid to an outside.

Preferably, the coolant circulation path may be provided by a groove formed in at least one of the outer plate member and the inner plate member.

Preferably, the work transfer apparatus of the present invention may further comprise a plate member superposed on an inner surface of the sealed box, where the coolant circulation path is disposed at an interface between the inner surface and the plate member.

Preferably, the work transfer apparatus of the present invention may further comprise an air-tight seal disposed between the inner surface and the plate member.

Preferably, the coolant circulation path may be provided by a groove formed in at least one of the inner surface and the plate member.

Preferably, the work transfer apparatus of the present invention may further comprise: a scissors lift mechanism that supports the work carrying mechanism and vertically moves the work carrying mechanism; a base seat on which the scissors lift mechanism is mounted; and a rotation mechanism that rotates the base seat about a vertical axis. The work carrying mechanism may include a hand for holding the work, and a hand mechanism for horizontally reciprocating the hand.

Preferably, the scissors lift mechanism may include: a stage on which the work carrying mechanism and the driving source are mounted; a first scissors link; a second scissors link; and a lifting driver mounted on the base seat for driving the first and the second scissors links. Each of the first and the second scissors links may include a first crossing arm and a second crossing arm intersecting with each other at a respective central portion and connected to each other rotatably about a horizontal axis. The first crossing arm may include an upper end portion and a lower end portion, where the upper end portion may be horizontally slidable with respect to the stage, and the lower end portion may be connected to the base seat rotatably about a horizontal axis. The second crossing arm may include an upper end portion and a lower end portion, where the upper end portion of the second crossing arm may be connected to the stage rotatably about a horizontal axis, and the lower end portion of the second crossing arm may be connected to the base seat horizontally slidable with respect to the stage. The lifting driver may be connected to the lower end portions of the respective second crossing arms.

Preferably, the work transfer apparatus of the present invention may further comprise a lower pipe, an upper pipe and an intermediate pipe communicating with the lower pipe and the upper pipe, where the lower pipe may be arranged to extend from the lower end portion to the central portion of the first crossing arm of the first scissors link, the upper pipe may be arranged to extend from the upper end portion to the central portion of the second crossing arm of the second scissors link, and the intermediate pipe may be arranged to extend between the central portion of the crossing arms of the first scissors link and the central portion of the crossing arms of the second scissors link.

Preferably, the work transfer apparatus of the present invention may further comprise a through pipe provided at the base seat, where the through pipe may extend via the lower end portion of the first crossing arm of the first scissors link and communicate with the lower pipe, and the upper pipe may be connected to the sealed box via a connection pipe.

Preferably, the work transfer apparatus of the present invention may further comprise a coolant circulation pipe connected to the coolant circulation path at the sealed box, where the coolant circulation pipe may be accommodated within a pipeline formed by the through pipe, the lower pipe, the intermediate pipe, the upper pipe and the connection pipe.

Other features and advantages of the present invention will become more apparent through the detailed description given hereunder referring to the accompanying drawings.

DETAILED DESCRIPTION OF THE PREFERRED EMBODIMENTS

Preferred embodiments of the present invention will be described below with reference to the accompanying drawings.

Figure 1:
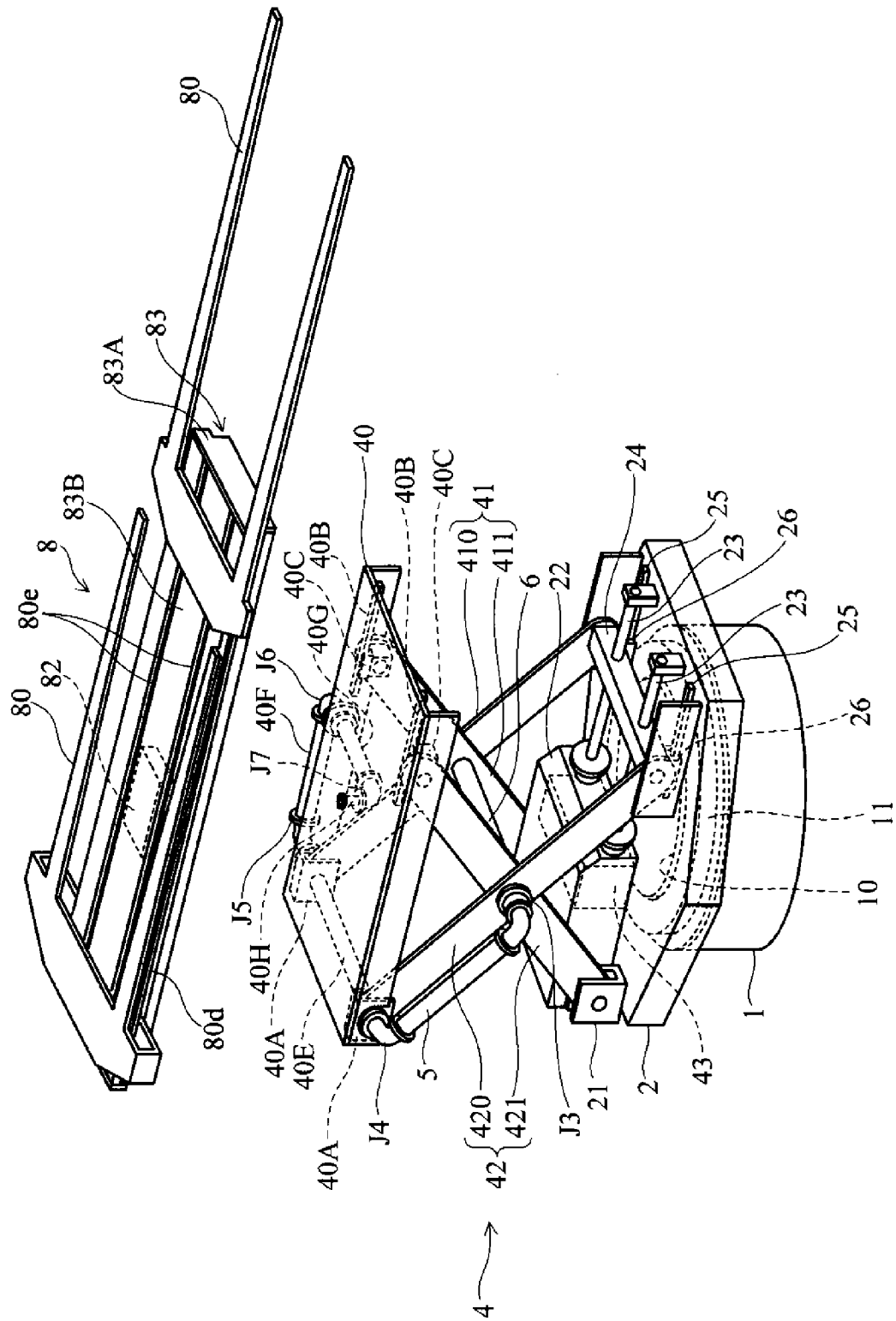
FIG. 1 is a perspective view showing a work transfer apparatus according to an embodiment of the present invention.

FIGS. 1 to 6 depict a work transfer apparatus according to an embodiment of the present invention. The work transfer apparatus A is intended for carrying a thin plate-shaped work such as an LCD panel. The work transfer apparatus A includes a base unit 1 that accommodates a rotation mechanism, a base seat 2, a scissors lift mechanism 4, an upper pipe 5, an intermediate pipe 6, a lower pipe 7, and a hand mechanism 8 for carrying a work. The base unit 1 is located in an atmospheric-pressure space outside of a non-illustrated chamber (for example, a space below the floor of the chamber), while the base seat 2, the scissors lift mechanism 4, the upper pipe 5, the intermediate pipe 6, the lower pipe 7, and the hand mechanism 8 are located, for example, in a vacuum inside the chamber. For easier understanding, FIG. 1 depicts a separated state of the scissors lift mechanism 4 and the hand mechanism 8. By the work transfer apparatus A, a work heated up to about 200° C. is carried. The inside of the chamber does not have to be a complete vacuum space, but may be a space the inner pressure of which is lower than the atmospheric pressure by a certain degree, or even higher than the atmospheric pressure. Further, the inside of the chamber may be filled with a gas (e.g. nitrogen gas) other than air.

The base unit 1 accommodates a rotation mechanism that rotates the base seat 2 about a vertical axis. The rotation mechanism is constituted of a planet gear mechanism including a rotational driving motor, for example. The rotation mechanism includes a rotating shaft 10 (see FIG. 1) which is hollow and connected to a lower face of the base seat 2 via a sealed bearing 11. The rotation of the rotating shaft 10 causes the base seat 2 to rotate about the vertical axis. The inside of the base unit 1 is maintained at the atmospheric pressure. The base unit 1 is designed to accommodate the rotation mechanism for the base seat 2, but does not accommodate a motor for driving the scissors lift mechanism 4 nor a motor for driving the hand mechanism 8. Thus, the height of the base unit 1 can be smaller than is conventionally possible.

The base seat 2 supports the scissors lift mechanism 4 from below. The upper face of the base seat 2 is provided with a through pipe 3 (see FIG. 2). The through pipe 3 extends downward into the hollow portion of the rotating shaft 10 until its lower end portion reaches the inside of the base unit 1. The upper end portion of the through pipe is connected to the lower pipe 7 through a lower relay pipe 30.

The scissors lift mechanism 4 moves the hand mechanism 8 vertically, both up and down as required. The scissors lift mechanism 4 includes a stage 40 on which the hand mechanism 8 is mounted, a first and a second scissors links 41-42, and a lift driving motor 43. The first and the second scissors links 41, 42 are disposed parallel to and spaced from each other to be located on the respective sides of the stage 40. The first scissors link 41 includes a pair of crossing arms 410, 411, and the second scissors link 42 includes a pair of crossing arms 420, 421 that are substantially identical in shape and size to the crossing arms 410, 411.

On a rear end portion of the upper face of the base seat 2, a pair of brackets 21 and a pair of bearings are provided so as to connect a respective lower end portion of the crossing arms 411, 421 rotatably about a horizontal axis. Between the two brackets 21, a hermetically sealed motor box 22 for accommodating the lift driving motor 43 is provided. On a front end portion of the upper face of the base seat 2, a pair of ball screw shafts 23, and a nut block 24, as well as a pair of slide rails 25 and a pair of linear blocks 26 are provided so as to connect a respective lower end portion of the crossing arms 410, 420 in a horizontally slidable manner, both back and forth. The ball screw shafts 23 are rotated by the lift driving motor 43, thereby causing the nut block 24 (thread-engaged with the ball screw shafts 23) to slide back and forth. To the end portions of the nut block 24, the lower end portions of the crossing arms 410, 420 are rotatably connected, respectively. The lower end portions of the crossing arms 410, 420 are supported by the slide rails 25 via the linear block 26.

Figure 3:
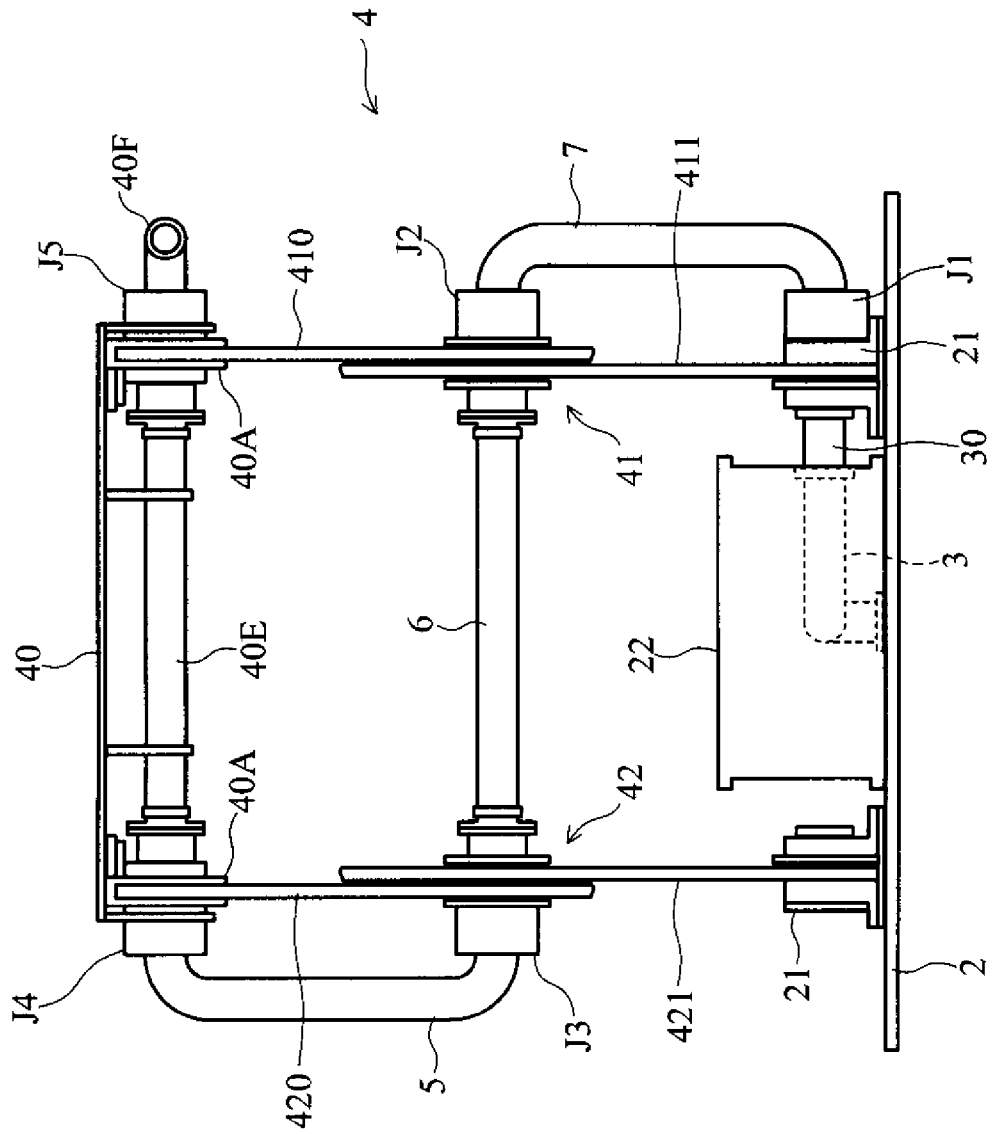
FIG. 3 is a fragmentary front view of the work transfer apparatus.

As shown in FIG. 3, the through pipe 3 is introduced into the hermetically sealed motor box 22, and connected to the lower relay pipe 30. The lower relay pipe 30 sticks out from the motor box 22 and is connected to a swivel joint J1. The swivel joint J1 extends through the lower end portion of the crossing arm 411 and the bracket 21, and is connected to the lower end portion of the lower pipe 7. In other words, the lower relay pipe 30 is connected to the lower end portion of the lower pipe 7 via the swivel joint J1.

As shown in FIG. 3, the upper pipe 5 is disposed outside of the crossing arm 420, extending from the upper end portion to the central portion of the arm 420. The intermediate pipe 6 is arranged to connect the central portion of the crossing arms 410-411 and the central portion of the crossing arms 420-421. The lower pipe 7 is disposed outside of the crossing arm 411, extending from the central portion to the lower end portion of the arm 411. An L-shaped joint J2 is disposed so as to extend through the middle portion where the crossing arms 410, 411 intersect with each other. The upper end portion of the lower pipe 7 is connected to an end portion of the intermediate pipe 6 via the L-shaped joint J2. The other end portion of the intermediate pipe 6 is connected to a swivel joint J3. The swivel joint J3 is disposed so as to extend through the middle portion where the crossing arms 420, 421 intersect with each other. The swivel joint J3 is connected to the lower end portion of the upper pipe 5.

As shown in FIG. 1, the hand mechanism 8 is fixed to the upper face of the stage 40. A rear end portion of the lower face of the stage 40 is provided with a pair of brackets 40A and a pair of bearings (not shown) for connecting the respective upper end portions of the crossing arms 410, 420 rotatably about a horizontal axis. A front end portion of the lower face of the stage 40 is provided with a pair of slide rails 40B and a pair of linear guides 40C for connecting the respective upper end portions of the crossing arms 411, 421 in a horizontally slidable manner, both back and forth. A region from the rear end portion to a central portion of the lower face of the stage 40 is provided with connection pipes 40E, 40F, 40G and a through connection pipe 40H. An end portion of the connection pipe 40E is connected to a swivel joint J4. The swivel joint J4 extends through the upper end portion of the crossing arm 420 and the bracket 40A. The swivel joint J4 is connected to the upper end portion of the upper pipe 5. The other end portion of the connection pipe 40E is connected to an L-shaped joint J5. The L-shaped joint J5 extends through the upper end portion of the crossing arm 410 and the bracket 40A. The L-shaped joint J5 is connected to an end portion of the connection pipe 40F. The other end portion of the connection pipe 40F is connected to an end portion of the connection pipe 40G via an L-shaped joint J6. The other end portion of the connection pipe 40G is connected via an L-shaped joint J7 to a lower end portion of the through connection pipe 40H. The through connection pipe 40H extends through the central portion of the stage 40. An upper end portion of the through connection pipe 40H is connected to the sealed box 82 of the hand mechanism 8 (see FIG. 6).

The above-noted through pipe 3, lower relay pipe 30, upper pipe 5, intermediate pipe 6, lower pipe 7, connection pipes 40E, 40F, 40G, and through connection pipe 40H constitute a pipeline extending from the inside of the base unit 1 to the hand mechanism 8. The pipeline is hermetically sealed so that the inside pressure is to be maintained at the atmospheric pressure. The pipeline accommodates therein power supply cables for slide-driving motors 82C, 82D and the lift driving motor 43, while also accommodating coolant circulation pipes P1, P2 for cooling the driver of the hand mechanism 8. Such configuration ensures that the power supply cables and the coolant circulation pipes P1, P2 are arranged from the inside of the base unit 1 to the motor box 22 or the hand mechanism 8, without being exposed to the vacuum. As a coolant to be supplied into the circulation pipes P1, P2, use may be made of a liquid such as water or a gas such as dry air.

The hand mechanism 8 includes a pair of hands 80 for holding works, a pair of belt slide mechanisms 81 (see FIG. 4) serving as a reciprocation mechanism that linearly reciprocates the hands 80 horizontally back and forth independently from each other, a sealed box 82 that accommodates a driver for operating the belt slide mechanisms 81, and a guide member 83 (see FIG. 1) for holding the belt slide mechanisms 81 and the sealed box 82.

Figure 4:
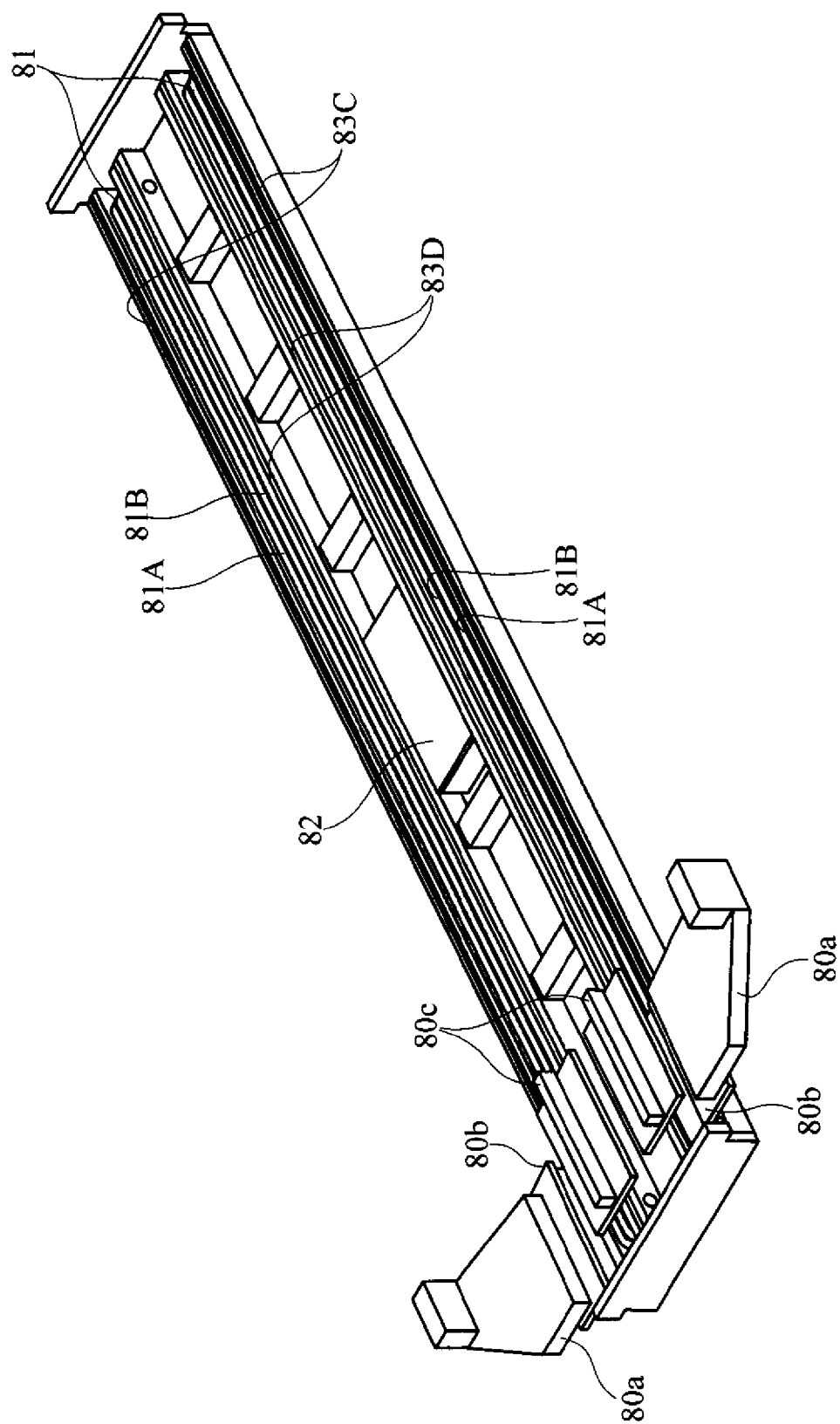
FIG. 4 is a perspective view showing a hand mechanism for the work transfer apparatus.

As shown in FIG. 1, the guide member 83 includes a main body 83A and a cover 83B, and has a rectangular shape in plan view. As shown in FIG. 4, the main body 83A includes a first pair of guide rails 83C and a second pair of guide rails 83D, where each pair extends longitudinally of the main body 83A. The first guide rails 83C movably support a lower end portion 80a of one of the hands 80 via a slider 80b, and the second guide rails 83D movably support a lower end portion of the other hand 80 via another slider 80c. The first and second hands 80 are so arranged not to interfere with each other when moved along the rails. The first and the second guide rails 83C, 83D are covered with the cover 83B. For allowing the protrusion of the sliders 80b, 80c (see FIG. 4), the cover 83B is formed with slits 80d, 80e (see FIG. 1), which correspond in position to the guide rails 83C and 83D. The lower end portion 80a of the first hand 80 is formed so as to circumvent the outside of the second hand 80. The two hands 80 are vertically spaced away from each other by a predetermined gap.

Referring to FIG. 4, the respective belt slide mechanisms 81 are arranged to extend longitudinally between the first and the second guide rail 83C, 83D. The pair of belt slide mechanisms 81 each includes a pair of driving belts, i.e. an inner belt 81A and an outer belt 81B (see FIG. 5), looped about pulleys. In the FIG. 4, for example, the two belts 81A, 81B of the right belt slide mechanism 81 are connected to the lower end portion 80a of the upper hand 80 via the slider 80b. When the belts 81A, 81B rotate, the upper hand 80 is caused to move horizontally. Likewise, the two belts 81A, 81B of the left belt slide mechanism 81 are connected to the lower end portion of the lower hand 80 via the slider 80c. When these belts 81A, 81B rotate, the lower hand 80 is caused to move horizontally. Instead of such an arrangement, only one belt may be provided for each hand 80.

Figure 5:
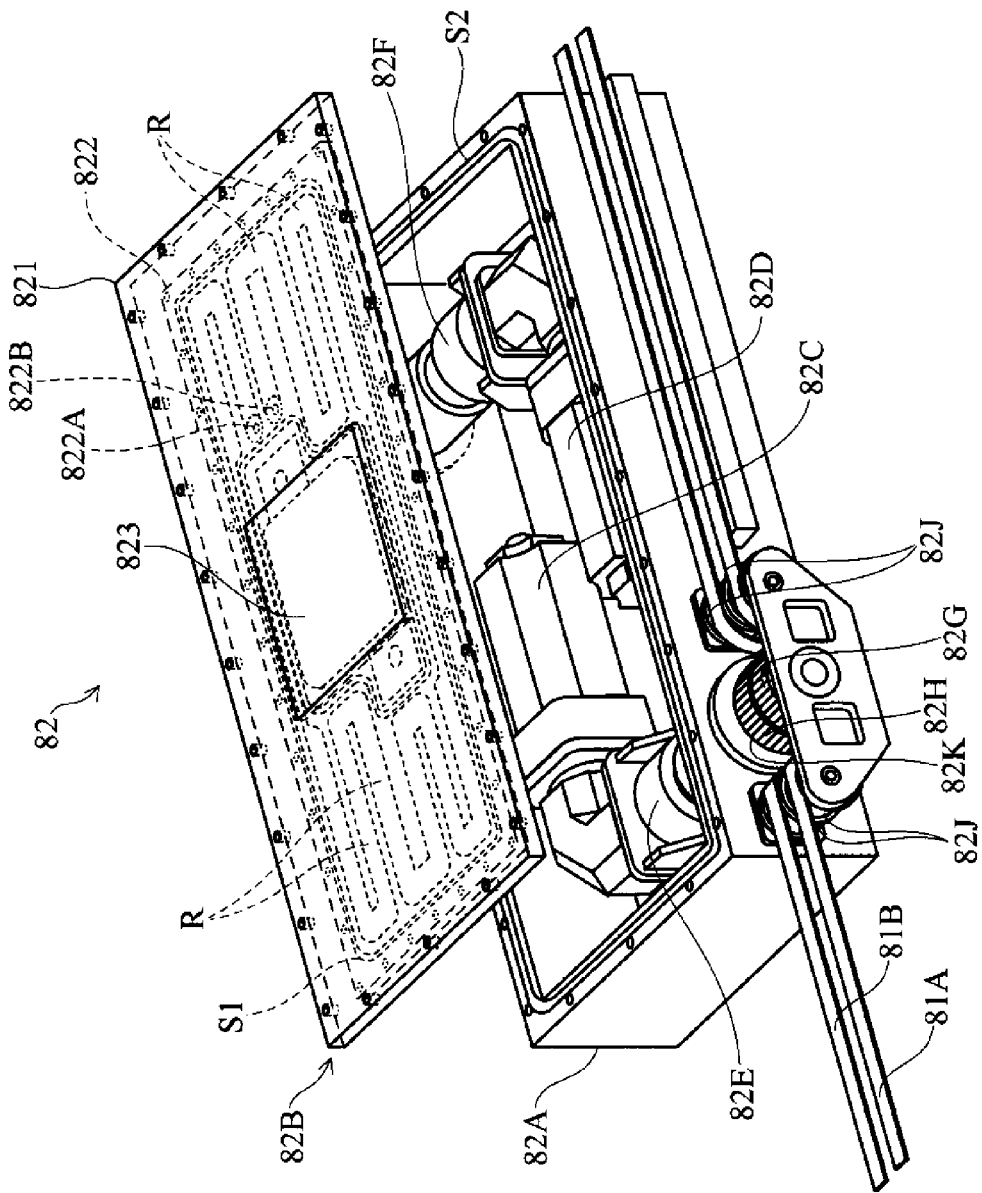
FIG. 5 is a perspective view showing a sealed box provided at the hand mechanism.

As shown in FIG. 4, the sealed box 82 is located at a generally central portion of the main body 83A, and between two guide rails 83C. As shown in FIG. 5, the sealed box 82 includes a box body 82A having an opening, and a partition lid 82B that tightly closes the opening. The sealed box 82 accommodates therein the slide-driving motors 82C, 82D and reduction gears 82E, 82F that transmit the driving force of the slide-driving motor 82C, 82D. The belts 81A, 81B are rotated by the slide-driving motor 82C. Specifically, on each lateral face of the sealed box 82, driving gears 82G, 82H and tension rollers 82J. These driving gears 82G, 82H and tension roller 82J are engaged with the belts 81A, 81B. The driving gears 82G, 82H shown in FIG. 5 are provided on a drive shaft of the reduction gear 82E sticking out from the lateral face of the box body 82A via a sealed bearing 82K. The rotating speed and rotating direction of the driving gears 82G, 82H can be varied by controlling the slide-driving motor 82C. Though not illustrated in FIG. 5, the opposite side of the box body 82A is provided with another pair of belts 81A, 81B, driving gears and tension rollers engaged with the belts 81A, 81B. The rotating speed and rotating direction of these driving gears can be varied by controlling the slide-driving motor 82D. The slide-driving motors 82C, 82D can be controlled independently of each other, and therefore the two pairs of belts 81A, 81B can be driven independently. Accordingly, the upper and the lower hands 80 are slidable independent of each other.

Figure 6:
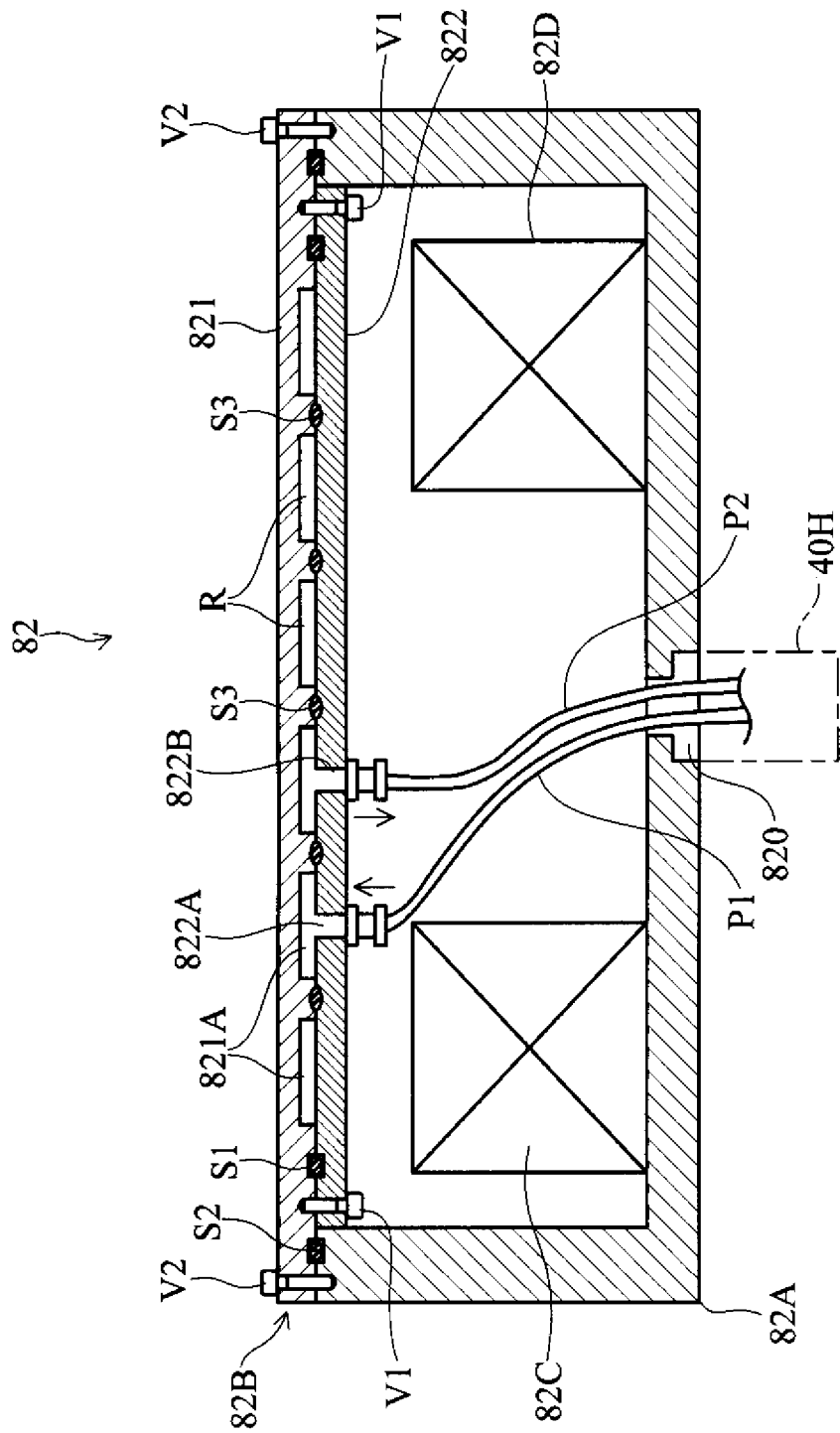
FIG. 6 is a cross-sectional view of the sealed box.

As shown in FIG. 6, the box body 82A includes a communication orifice 820 formed through the bottom portion thereof, for introducing the coolant circulation pipes P1, P2 into the sealed box. The through connection pipe 40H on the stage 40 is hermetically connected to the communication orifice 820.

The partition lid 82B includes an outer plate member 821 and an inner plate member 822 superposed on each other and joined with bolts V1. The outer plate member 821 and the inner plate member 822 are joined with an annular air-tight seal S1 interposed between the respective peripheral portions thereof. The outer plate member 821 is of a size corresponding to the periphery of the opening of the box body 82A. The inner plate member 822 is of a size that fits inside the opening of the box body 82A. Accordingly, the periphery of the outer plate member 821 protrudes outward from the inner plate member 822. The protruding periphery of the outer plate member 821 is brought into contact with the periphery of the opening of the box body 82A. Thus, the partition lid 82B is attached to the opening of the box body 82A, thereby creating an air-tight state. More specifically, the periphery of the outer plate member 821 is joined to the periphery of the opening of the box body 82A with bolts V2, with an annular air-tight seal S2 interposed therebetween. The inner plate member 822 as a whole is located within the box body 82A.

As shown in FIG. 5, the partition lid 82B (the outer plate member 821 and the inner plate member 822) is provided, at its central portion, with a cover 823 for maintenance. In a manner avoiding the cover 823, a flow path R for coolant circulation is provided between the opposing faces of the outer plate member 821 and the inner plate member 822. The flow path R is arranged to be bent a predetermined number of times so as to have a large flow area. As shown in FIG. 6, the flow path R is provided by grooves 821A formed in the surface of the outer plate member 821. Between two adjacent grooves 821A is provided an air-tight seal S3, which is formed by applying a liquid gasket before the two plate members are joined to each other. After solidifying, the liquid gasket has rubber-like elasticity. The air-tight seal S3 prevents leakage of the coolant from the flow path R. Even if the coolant leaks from the flow path R, the air-tight seals S1, S2 can prevent the coolant leakage to outside. In addition, the inner plate member 822, which is located within the box body 82A, further assures the restriction of the coolant leakage to the outside of the box body 82A. The inner plate member 822 is provided with an inlet 822A and an outlet 822B, each communicating with the flow path R. To the inlet 822A, the upstream side coolant circulation pipe P1 introduced into the box body 82A is connected, while to the outlet 822B, the downstream side coolant circulation pipe P2 is connected. The flow path R for coolant circulation makes it possible to efficiently cool the slide-driving motors 82C, 82D and the reduction gears 82E, 82F.

The workings of the above work transfer apparatus will be described below.

To carry the work in the vacuum, the hand mechanism 8 retains and horizontally moves the work, and the scissors lift mechanism 4 is driven so as to vertically lift and lower the entire hand mechanism 8. The rotation mechanism installed in the base unit 1 rotates the scissors lift mechanism 4 and the hand mechanism 8 together. Thus, the work is carried from a predetermined position in a three-dimensional space to a desired position.

Figure 2:
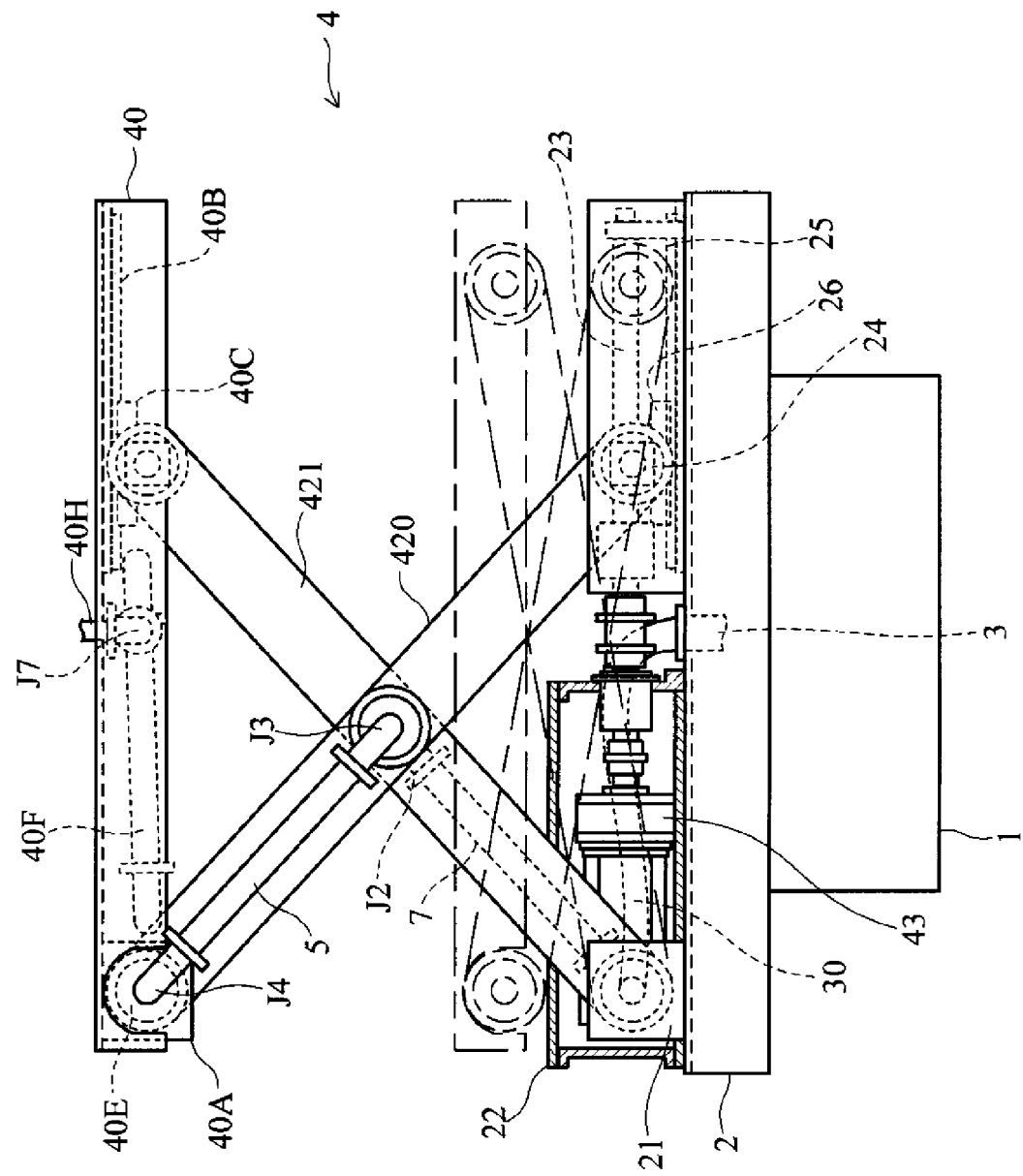
FIG. 2 is a fragmentary side view of the work transfer apparatus.

As shown in FIG. 2, to activate the scissors lift mechanism 4, the ball screw shaft 23 is rotated so that the nut block 24 is made to horizontally slide back and forth along the ball screw shaft 23. Since the respective lower end portions of the crossing arms 410, 420 are connected to each end portion of the nut block 24, the lower end portions of the crossing arms 410, 420 are caused to slide along the slide rail 25.

With the sliding motion of the lower end portions of the crossing arms 410, 420, the lower end portions of the crossing arms 411, 421 and the upper end portions of the crossing arms 410, 420 are made to rotate about the bracket 21, 40A, and the upper end portions of the crossing arms 411, 421 are slave-driven to slide along the slide rail 40B. Thus, the stage 40 is vertically lifted or lowered while being kept in its horizontal posture.

For instance, when the stage 40 is vertically lowered to a position indicated by dash-dot lines in FIG. 2 by the scissors lift mechanism 4, the non-illustrated hand mechanism 8 as a whole mounted on the stage 40 is also lowered to a minimal height from the base seat 2, so that the hand 80 can be set at a lowest possible level.

Even though the stage 40 is lowered to a lowest level by the scissors lift mechanism 4, there is a certain amount of gap in a vertical direction between the base seat 2 and the stage 40, due to the structural characteristics of the scissors lift mechanism 4. Accordingly, by installing the motor box 22 such that the motor box is accommodated within the vertical gap, it is possible not only to reduce the vertical dimension of the scissors lift mechanism 4, but also to make effective use of the space above the base seat 2.

The height of the motor box 22 depends on e.g. the size of the lift driving motor 43, and hence it may not always be possible to accommodate the motor box 22 within the gap to be present when the stage 40 is brought to the lowest position. More specifically, when the stage 40 is lowered to the lowest position by the movement of the scissors lift mechanism 4, the motor box 22 may interfere with the stage 40 or the connection pipes 40E, 40G. Such interference can be avoided by limiting the vertical movement range of the scissors lift mechanism 4 so as not to allow the motor box 22 to come into contact with the stage 40 or the pipes 40E, 40G. Alternatively, use may be made of a mechanism for contact prevention.

Another solution is, for example, to arrange the motor box 22 at a position where no interference with the stage 40 or the connection pipes 40E, 40G occurs. To this end, if necessary, the base seat 2 may be enlarged. In this case, a gear box may be provided between the lift driving motor 43 and the ball screw shaft 23 when necessary, so that the motor box 22 can be disposed at a desired position.

When the scissors lift mechanism 4 operates, the positional relation between the upper pipe 5, the intermediate pipe 6, the lower pipe 7, and the connection pipe 40E attached to the crossing arms 410, 411, 420, 421 will vary. However, since the upper pipe 5, the intermediate pipe 6, the lower pipe 7, and the connection pipe 40E are connected rotatably to each other via the hermetically sealed swivel joints J1, J3, J4 and the L-shaped joint J2, the routing of the power supply cable and the coolant circulation pipes disposed in those pipes is not disturbed. During the operation of the rotation mechanism also, the power supply cable and the coolant circulation pipes are kept from being unduly tangled or twisted, and the routing thereof can be stably maintained along the crossing arms 410, 411, 420, 421.

The hand mechanism 8 is most susceptible to thermal influence by radiant heat from the work heated. In particular, the slide-driving motors 82C, 82D, which are required to achieve high positioning accuracy in carrying the work, need to be isolated from the thermal influence. Accordingly, in the embodiment, the sealed box 82 containing therein the slide-driving motors 82C, 82D is provided with the flow path R for coolant circulation, so that the coolant circulating through the flow path R efficiently cools the slide-driving motors 82C, 82D. This arrangement mitigates the thermal influence on the slide-driving motors 82C, 82D.

In the work transfer apparatus A according to this embodiment, therefore, while the slide-driving motors 82C, 82D of the hand mechanism 8 are located close to the work, the slide-driving motors 82C, 82D are accommodated in the sealed box 82 including the flow path R for coolant circulation, whereby the slide-driving motors 82C, 82D are efficiently cooled, and the work can be carried with high accuracy.

The hand mechanism 8, the scissors lift mechanism 4, and the rotation mechanism are provided to carry the work, among which only the rotation mechanism is to be located under the base seat 2. Thus, the vertical dimension of the base unit 1 accommodating therein the rotation mechanism can be reduced. Accordingly, the overall size of the work transfer apparatus can be reduced. In particular, the vertical size of the manufacturing equipment can be reduced. Specifically, the depth of the space under the floor for installing therein the base unit 1 can be reduced as much as possible.

The coolant circulation pipes P1, P2 are arranged through the pipeline disposed from the base unit 1 to the hand mechanism 8, and therefore the routing of the coolant circulation pipes P1, P2 can be stably maintained irrespective of the movement of the scissors lift mechanism 4 and the rotation mechanism.

Figure 7:
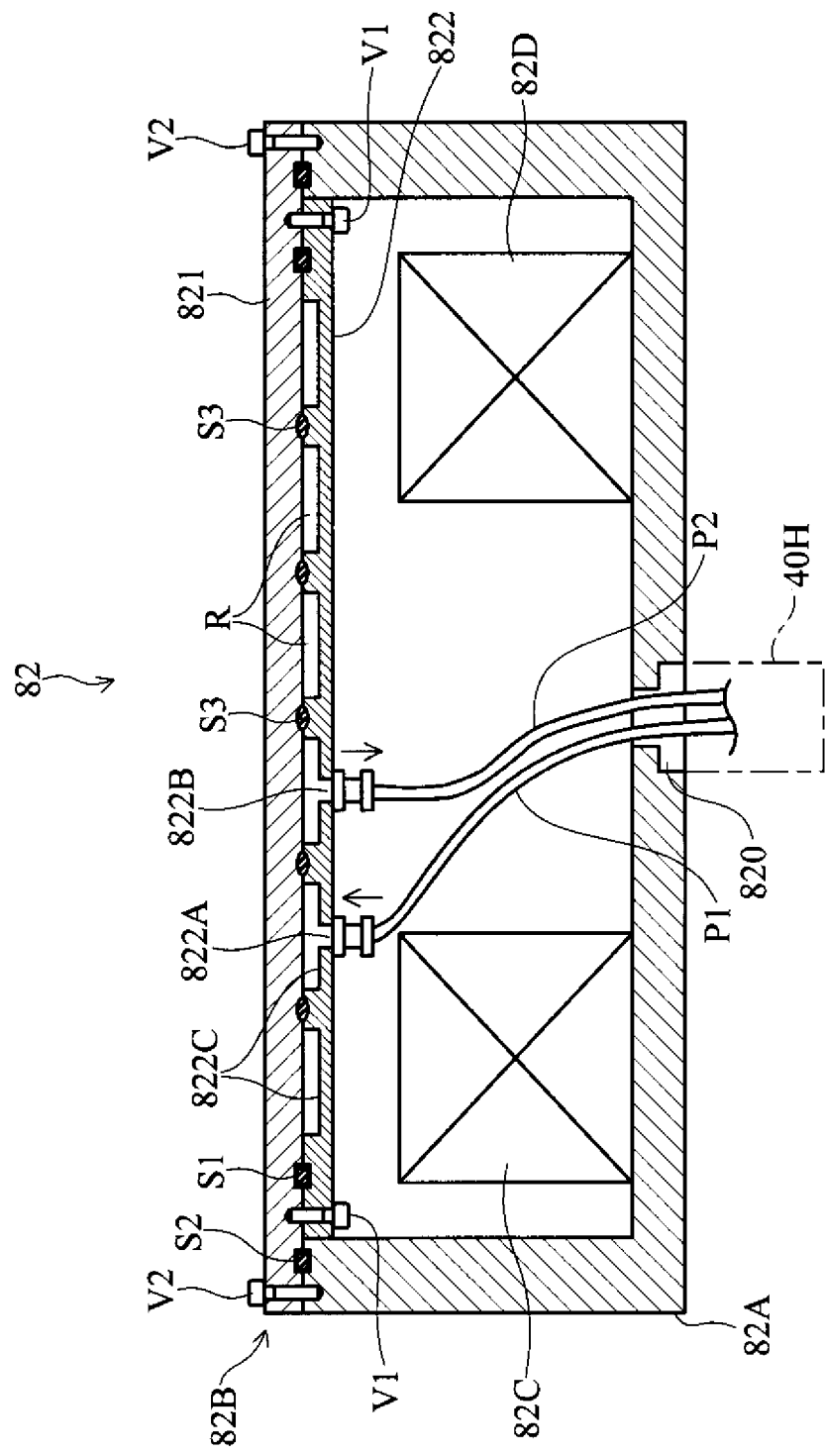
FIG. 7 is a cross-sectional view showing a first example of modified sealed box.
Figure 8:
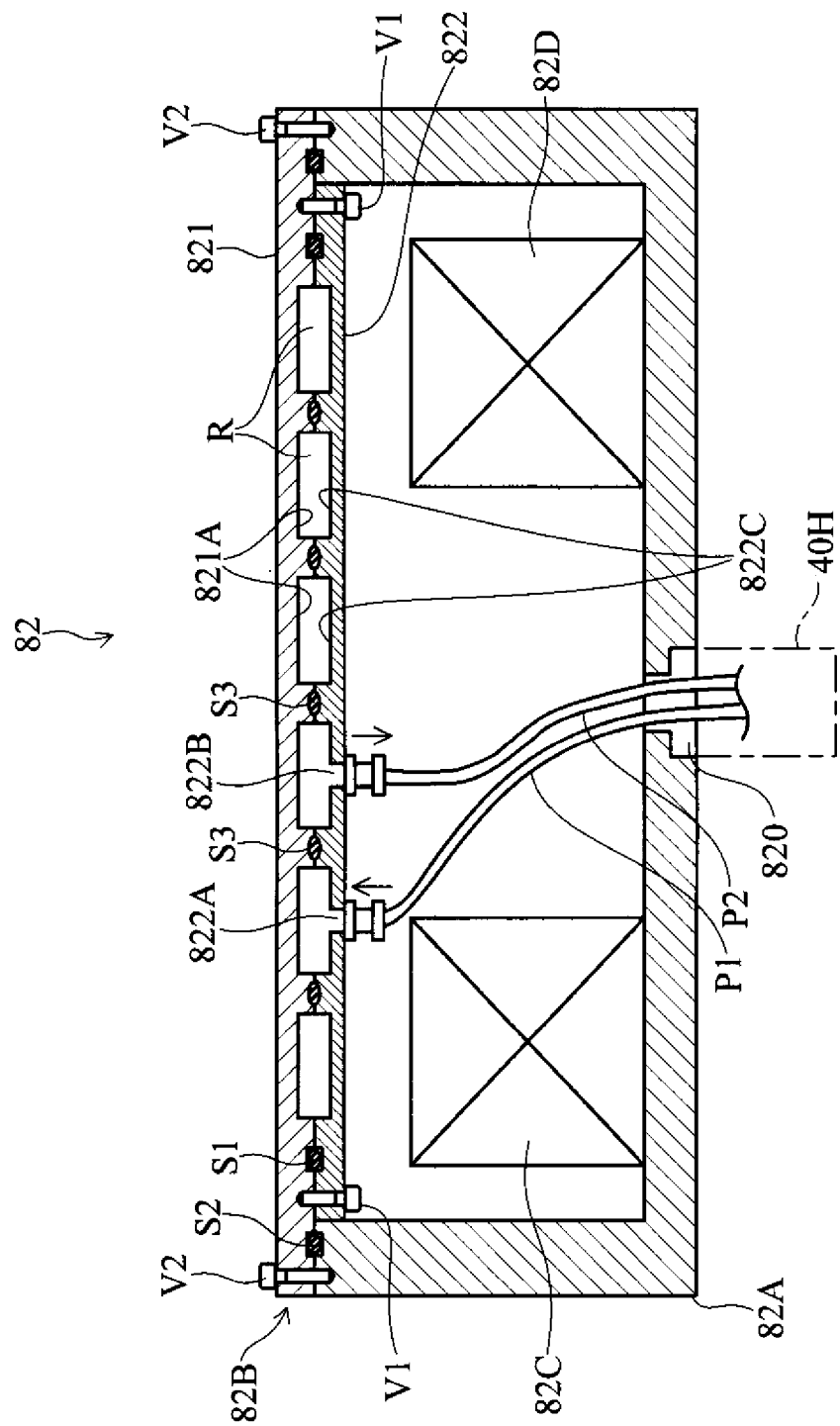
FIG. 8 is a cross-sectional view showing a second example of modified sealed box.
Figure 9:
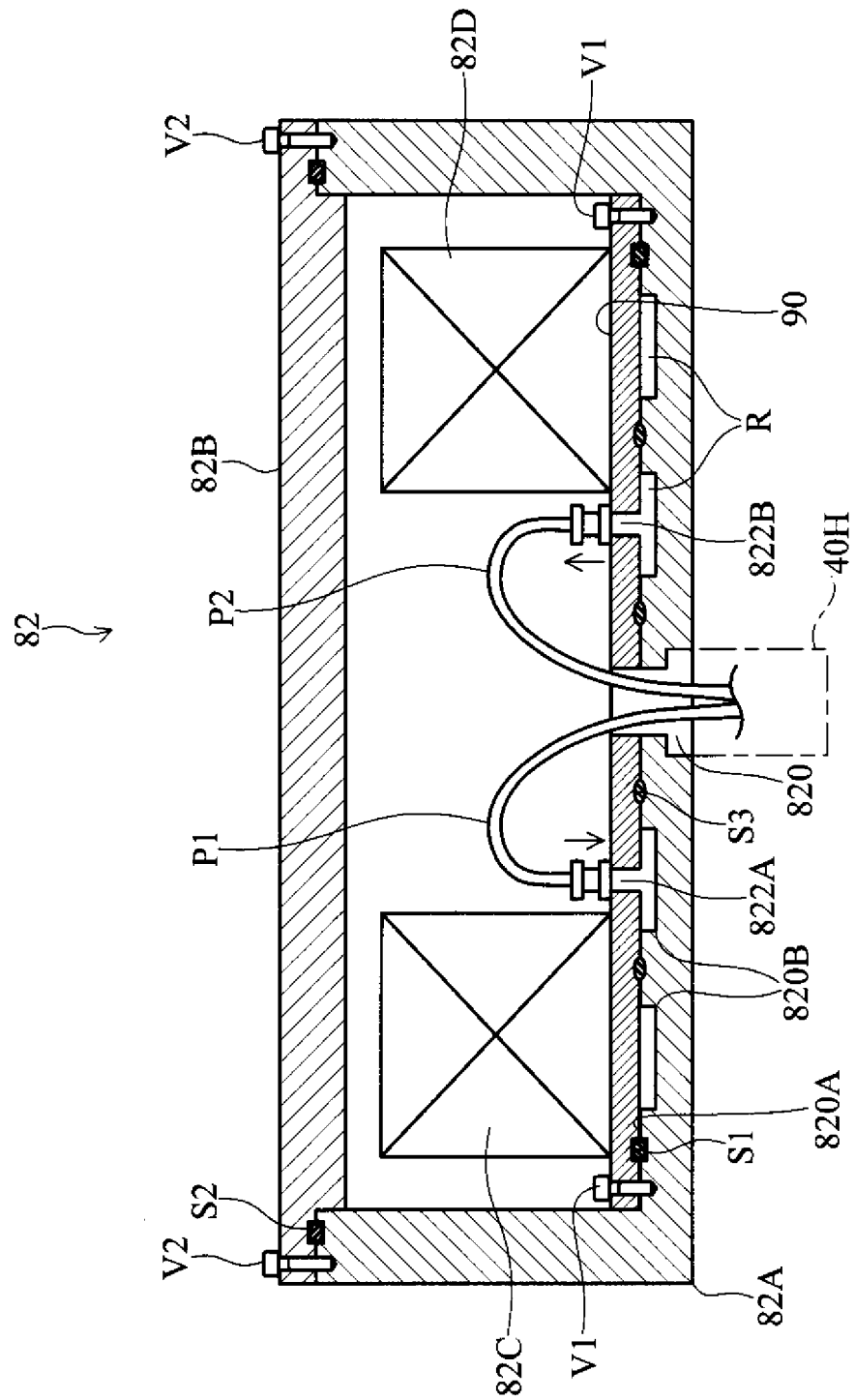
FIG. 9 is a cross-sectional view showing a third example of modified sealed box.

FIGS. 7 to 9 depict modifications of the above-described sealed box 82. In these figures, elements identical or similar to those shown in FIG. 6 are indicated by the same reference numerals, and description thereof may not be repeated.

In the sealed box 82 shown in FIG. 7, the flow path R is provided by a groove 822C formed in the bonding surface of the inner plate member 822.

In the sealed box 82 in FIG. 8, the flow path R is provided by the groove 821A formed in the outer plate member 821 and the groove 822C formed in the inner plate member 822, coupled to each other. Such configuration provides an increased sectional area of the flow path R compared to that of the foregoing arrangements shown in FIGS. 6 and 7, thereby enhancing the cooling effect.

In the sealed box 82 shown in FIG. 9, the partition lid 82B is of a single plate structure, having no flow path R formed in the lid 82B. As shown in the figure, a plate member 90 is attached to an inner surface 820A of the bottom wall of the box body 82A. The flow path R for coolant circulation is provided along the interface between the inner surface 820A and the plate member 90. More specifically, the flow path R is provided by a groove 820B formed in the inner surface 820A.

As a modification of the sealed box 82 shown in FIG. 9, like the arrangement shown in FIG. 7 or 8, only the plate member 90 may be formed with a groove, or both the inner surface 820A and the plate member 90 may be formed with a groove. Further, it is also possible to attach a plate member to a side wall surface of the box body, and a flow path may be formed along the interface between the side wall surface and the plate member. Alternatively, a flow path may be formed in the bottom surface and the upper surface of the sealed box, or may be formed in the bottom surface, the upper surface and the side surface of the sealed box. In a case where a flow path is formed in more than one surface, the coolant circulation pipe may be branched at a halfway position as required, or use may be made of three or more circulation pipes. For instance, the coolant may be introduced through a coolant circulation pipe connected to the flow path formed in the upper surface, and a second pipe may be used for discharging the coolant from the upper-surface flow path. The second pipe may be connected to a flow path formed in the bottom surface, so that the coolant discharged from the upper-surface flow path is supplied to the bottom-surface flow path via the second pipe. The discharging of the coolant from the bottom-surface flow path may be attained by a third pipe.

The present invention is not limited to the foregoing embodiments. In the above-described example, the joints J1, J3, J4 are swivel joints, and the joints J2, J5 are non-rotating L-shaped joints. Instead, the joints J1, J2, J5 may be swivel joints, and the joints J3, J4 may be L-shaped joints. In any case, the rotation of at least the intermediate pipe 6 and connection pipe 40E needs to be ensured when the scissors lift mechanism 4 is operated. It is possible to arrange that all the joints J1-J5 are formed as swivel joints. However, a cost reduction can be attained by using L-shaped joints for some of all the joints, like the above-mentioned example.

The inner plate member 822 or the plate member 90 shown in FIGS. 6-9 has a size corresponding to the upper opening or the bottom surface of the box body 82A, though the present invention is not limited to this. The inner plate member 822 or the plate member 90 may be smaller in size than is illustrated.

The reciprocation mechanism that linearly reciprocates the hand horizontally back and forth may be a link mechanism using link arms.

The sealed box as a whole may have a cylindrical shape, other than the rectangular shape shown in FIG. 5.

Figure 10:
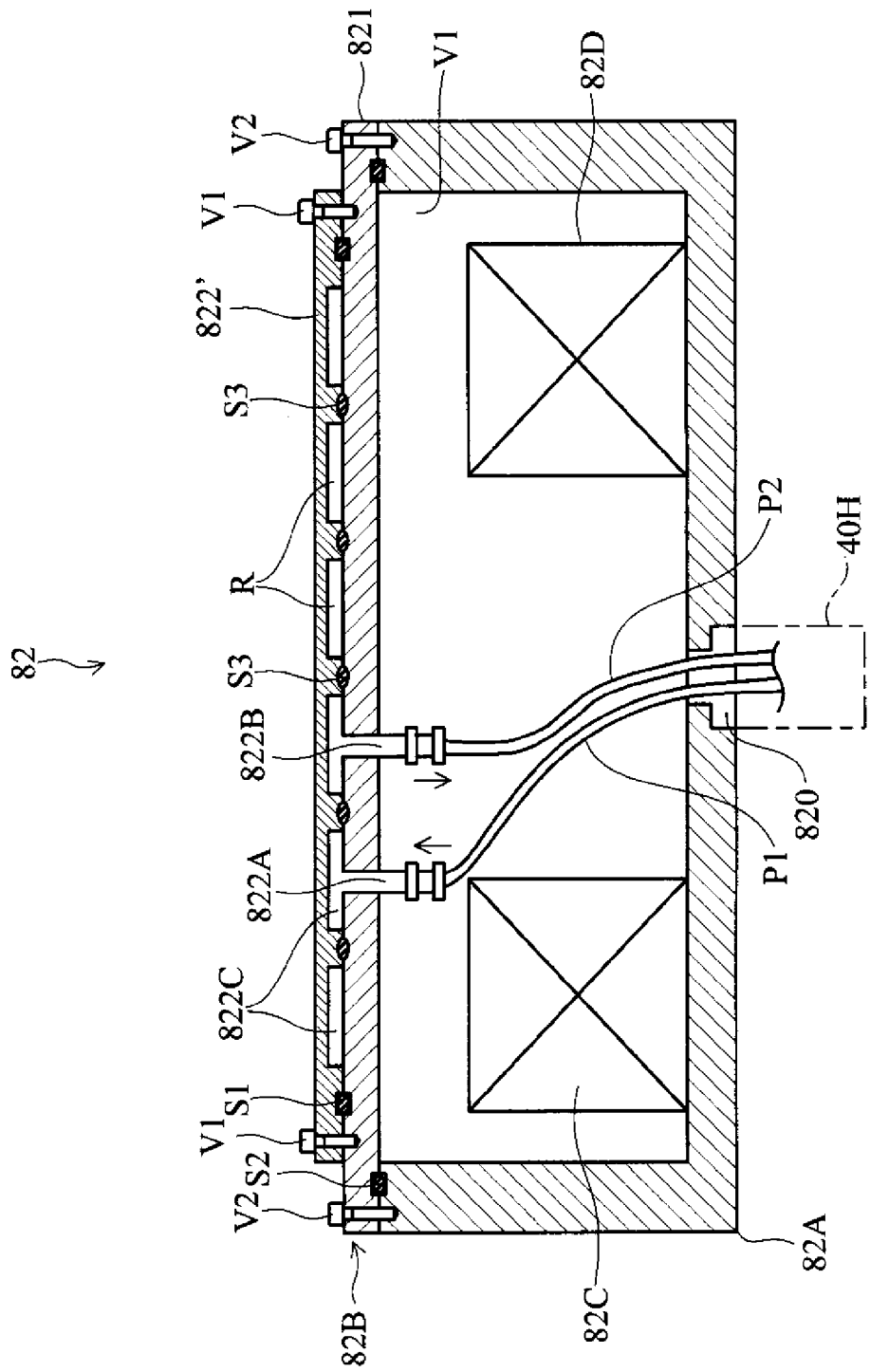
FIG. 10 is a cross-sectional view showing a fourth example of modified sealed box.

In the example shown in FIG. 7, the flow path R is provided on the inner (lower) side of the outer plate member 821. Alternatively, as shown in FIG. 10, a second outer plate member 822' may be attached to the outer (upper) surface of the first outer plate member 821, and a flow path R may be formed between the first and the second plate member 821, 822'.

The invention claimed is:

1. A work transfer apparatus comprising:
a work carrying mechanism that carries a work;
a driving source that drives the work carrying mechanism;
a sealed box that accommodates the driving source in a hermetically sealed state; and
a coolant circulation path provided in the sealed box for cooling the driving source;
wherein the sealed box includes a box body with an opening, and a partition lid for closing the opening, the partition lid including an outer plate member and an inner plate member superposed on the outer plate member, the coolant circulation path being disposed at an interface between the outer plate member and the inner plate member, and
wherein the coolant circulation path is provided by a groove formed in at least one of the outer plate member and the inner plate member.

2. The work transfer apparatus according to claim 1, further comprising an air-tight seal disposed between a periphery of the opening of the box body and the outer plate member, wherein the inner plate member is disposed entirely within the box body.

3. The work transfer apparatus according to claim 1, further comprising an air-tight seal disposed between the outer plate member and the inner plate member for preventing coolant supplied into the coolant circulation path from leaking from the partition lid to an outside.

4. A work transfer apparatus comprising:
a work carrying mechanism that carries a work;
a driving source that drives the work carrying mechanism;
a sealed box that accommodates the driving source in a hermetically sealed state; and
a coolant circulation path provided in the sealed box for cooling the driving source;
the work transfer apparatus further comprising a plate member superposed on an inner surface of the sealed box, wherein the coolant circulation path is disposed at an interface between the inner surface and the plate member.

5. The work transfer apparatus according to claim 4, further comprising an air-tight seal disposed between the inner surface and the plate member.

6. The work transfer apparatus according to claim 4, wherein the coolant circulation path is provided by a groove formed in at least one of the inner surface and the plate member.

* * * * *